United States Patent
Miyashita et al.

(10) Patent No.: US 10,332,594 B2
(45) Date of Patent: Jun. 25, 2019

(54) SEMICONDUCTOR MEMORY DEVICE WITH IN MEMORY LOGIC OPERATIONS

(71) Applicant: TOSHIBA MEMORY CORPORATION, Minato-ku, Tokyo (JP)

(72) Inventors: Daisuke Miyashita, Kanagawa (JP); Jun Deguchi, Kanagawa (JP)

(73) Assignee: TOSHIBA MEMORY CORPORATION, Tokyo (JP)

(*) Notice: Subject to any disclaimer, the term of this patent is extended or adjusted under 35 U.S.C. 154(b) by 0 days.

(21) Appl. No.: 15/905,020

(22) Filed: Feb. 26, 2018

(65) Prior Publication Data

US 2019/0088339 A1 Mar. 21, 2019

(30) Foreign Application Priority Data

Sep. 20, 2017 (JP) .................................. 2017-180319

(51) Int. Cl.

| G11C 13/00 | (2006.01) |
| G11C 16/26 | (2006.01) |
| G06F 7/544 | (2006.01) |
| H01L 25/18 | (2006.01) |
| H01L 23/48 | (2006.01) |
| H01L 23/00 | (2006.01) |
| G11C 16/04 | (2006.01) |
| G11C 7/08 | (2006.01) |

(52) U.S. Cl.
CPC ............ G11C 13/00 (2013.01); G06F 7/5443 (2013.01); G11C 16/26 (2013.01); G11C 7/08 (2013.01); G11C 16/0483 (2013.01); *H01L 23/481* (2013.01); *H01L 24/13* (2013.01); *H01L 24/16* (2013.01); *H01L 25/18* (2013.01); *H01L 2224/13025* (2013.01); *H01L 2224/16146* (2013.01); *H01L 2224/16225* (2013.01); *H01L 2224/17181* (2013.01)

(58) Field of Classification Search
CPC ... G11C 16/26; G11C 16/0483; G06F 7/5443; H01L 2224/16225; H01L 2224/16146; H01L 2224/13025; H01L 2224/17181; H01L 24/16; H01L 23/481; H01L 25/18; H01L 24/13
See application file for complete search history.

(56) References Cited

U.S. PATENT DOCUMENTS 5,379,257 A * 1/1995 Matsumura .......... G11C 7/1006
                                                       365/189.011
9,087,592 B2   7/2015 Sohn
(Continued)

*Primary Examiner* — Ajay Ojha
(74) *Attorney, Agent, or Firm* — Foley & Lardner LLP

(57) ABSTRACT

According to one embodiment, a semiconductor memory device includes a nonvolatile memory, a read circuit array, a multiply-accumulate operator array, a first bus, an operation controller circuit, and a second bus. The read circuit array reads the data from the nonvolatile memory. The multiply-accumulate operator array receives the data read from the read circuit array. The first bus is connected between the read circuit array and the multiply-accumulate operator array and having a first bit width. The operation controller circuit is electrically connected to the multiply-accumulate operator array. The second bus is connected to the operation controller circuit and having a second bit width smaller than the first bit width.

20 Claims, 6 Drawing Sheets

(56) References Cited

U.S. PATENT DOCUMENTS

| | | | |
|---|---|---|---|
| 2011/0032778 A1* | 2/2011 | Iwai | G11C 11/4076 365/189.16 |
| 2016/0098200 A1* | 4/2016 | Guz | G06F 11/30 711/154 |
| 2016/0149674 A1* | 5/2016 | Gunderson | H04L 1/24 375/224 |
| 2018/0025759 A1* | 1/2018 | Penney | G11C 7/1006 365/189.12 |

* cited by examiner

SEMICONDUCTOR MEMORY DEVICE WITH IN MEMORY LOGIC OPERATIONS

CROSS-REFERENCE TO RELATED APPLICATION

This application claims the benefit of and priority to Japanese Patent Application No. 2017-180319, filed Sep. 20, 2017, the entire contents of which are incorporated herein by reference.

FIELD

Embodiments described herein relate generally to a semiconductor memory device which includes a nonvolatile memory.

BACKGROUND

Deep learning is applied in various fields such as image processing and speech recognition, and expectations for hardware capable of performing an operation process on a large amount of data processed by the deep learning are increased. In such a device for performing the operation process on a large amount of data, data can be read from a memory cell array, and the read data can be supplied to an operation circuit to perform the operation process.

DETAILED DESCRIPTION

An exemplary embodiment provides a semiconductor memory device which is able to realize high speed and low power consumption of an operation process in an operation circuit.

In general, according to some embodiments, a semiconductor memory device includes a nonvolatile memory which stores data in a nonvolatile manner, a read circuit which reads the data from the nonvolatile memory, an operation circuit which receives the read data from the read circuit and carry out at least one operation, a first bus which is connected between the read circuit and the operation circuit and having a first bit width, a controller circuit which is electrically connected to the operation circuit, and a second bus which is connected to the controller and having a second bit width smaller than the first bit width.

Hereinafter, embodiments will be described with reference to the drawings. In the following explanation, components having the same function and configuration are given the same reference signs. In addition, devices and methods to specify technical ideas of the present disclosure will be exemplified for the embodiments described below, and materials, shapes, structures, and arrangements of the components may be defined in various forms including the following description.

Each functional block may be realized through one or more computer hardware and/or computer software components, or a combination thereof. Each functional block is not necessary to be distinctive as the examples of the present disclosure. For example, some of functions described as being executed by an exemplary functional block may be executed by a functional block different from the exemplary functional block. Further, the exemplary functional block may be subdivided into detailed functional blocks.

A semiconductor memory device of a first embodiment will be described.

Figure 1:
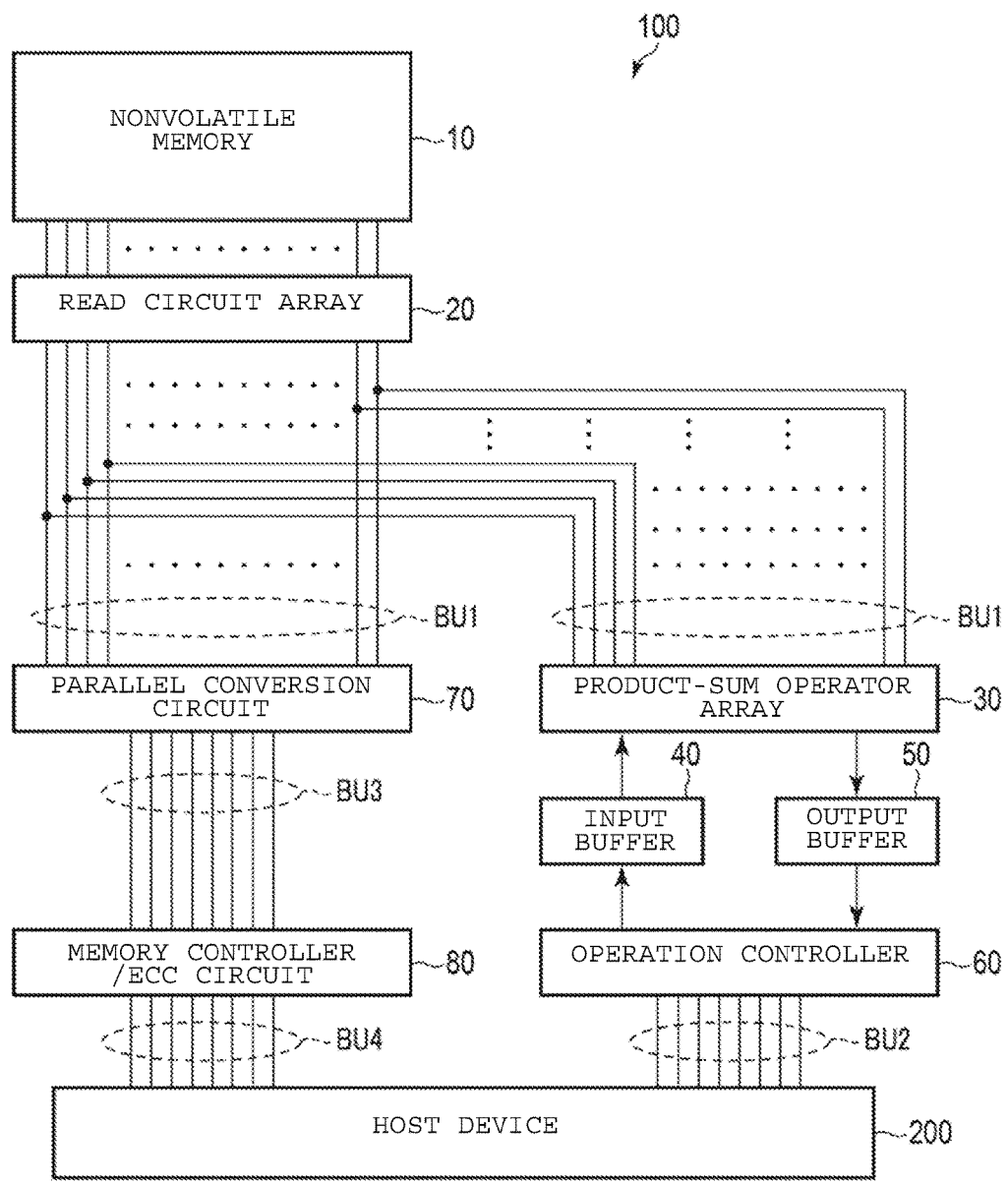
FIG. 1 is a circuit diagram illustrating a configuration of a semiconductor memory device of a first embodiment.

First, a configuration of a semiconductor memory device according to the first embodiment will be described. FIG. 1 is a circuit diagram illustrating the configuration of the semiconductor memory device of the first embodiment.

As illustrated in the drawing, a semiconductor memory device 100 includes a nonvolatile memory 10, a read circuit array 20, a multiply-accumulate operator array 30, an input buffer 40, an output buffer 50, an operation controller 60, a parallel conversion circuit 70, and a memory controller 80. In some embodiments, the operation controller 60 and the memory controller 80 are connected to an external host device 200 (for example, various types of computers).

The nonvolatile memory 10 includes, for example, a NAND flash memory. The NAND flash memory stores data in a memory cell in a nonvolatile manner. In the NAND flash memory, reading and programming are performed on a page basis, which means the memory cells in a page are simultaneously programmed and read. The size of page is typically several thousands of bits. A memory cell array of the NAND flash memory will be described below in detail.

In some embodiments, the read circuit array 20 includes sense amplifiers which are arranged in an array shape. The sense amplifiers may read the data stored in the memory cell of the nonvolatile memory 10 by a page or by bits smaller in number than bits of the page. Hereinafter, the data read by the read circuit array 20 are denoted as read data.

In some embodiments, a bus BU1 having a first bit width (for example, bits of the page) is connected between the read circuit array 20 and the multiply-accumulate operator array 30. The multiply-accumulate operator array 30 includes multiply-accumulate operators which are arranged in an array shape. The multiply-accumulate operator may perform a multiply-accumulate operation between the read data read from the nonvolatile memory 10 by the read circuit array 20 and an input data supplied from the input buffer 40, and output an operation result (hereinafter, referred to as operation data).

In some embodiments, the input buffer 40 temporarily stores the input data received from the operation controller 60. Further, the output buffer 50 may temporarily store the operation data received from the multiply-accumulate operator array 30.

In some embodiments, the operation controller 60 and the host device 200 are connected by a bus BU2 which has a second bit width smaller (or narrower) than the first bit width of the bus BU1. In other words, the bus width (the second bit width) of the bus BU2 may be smaller than the bus width (the first bit width) of the bus BU1. The operation controller 60 may receive a command supplied from the host device 200, and control the multiply-accumulate operator array 30 according to the received command. The operation controller 60 may supply the input data received from the host device 200 to the multiply-accumulate operator array 30 through the input buffer 40. The operation controller 60 may further receive the operation data output from the multiply-accumulate operator array 30 through the output buffer 50. Then, the operation controller 60 may output the operation data to the host device 200 using the bus BU2. The operation controller 60 may be configured as a circuit.

In some embodiments, similar to the multiply-accumulate operator array 30, the parallel conversion circuit 70 is connected with the read circuit array 20 by the bus BU1 which has the first bit width. The parallel conversion circuit 70 and the memory controller 80 may be connected by a bus BU3 which has a third bit width. The parallel conversion circuit 70 may convert the read data transmitted through the bus BU1 having the first bit width from the read circuit array 20 into data of the third bit width (for example, 8 bits) smaller than the first bit width (for example, 16 bits, 32 bits, or 64 bits). The third bit width may be the same as or different from the second bit width. Hereinafter, the data converted by the parallel conversion circuit 70 are denoted by conversion data. The parallel conversion circuit 70 may output the conversion data to the memory controller 80 using the bus BU3.

In some embodiments, the memory controller 80 and the host device 200 are connected by a bus BU4 which has a fourth bit width smaller (or narrower) than the first bit width of the bus BU1. In other words, the bus width (the fourth bit width) of the bus BU4 may be smaller than the bus width (the first bit width) of the bus BU1. The fourth bit width may be the same as or different from the third bit width. The memory controller 80 may receive a command supplied from the host device 200, and control the nonvolatile memory 10, the read circuit array 20, and the parallel conversion circuit 70 according to the command. The memory controller 80 may further include an ECC circuit. The ECC circuit may perform an error checking and correcting process (ECC) on the data. In other words, the ECC circuit may generate parity on the basis of write data when the data are programmed, generate a syndrome from the parity to detect an error and correct the error when reading the data. The memory controller 80 may perform the ECC process on the conversion data received from the parallel conversion circuit 70, and output the corrected data to the host device 200 using the bus BU4. The memory controller 80 may be configured as a circuit.

In some embodiments, in the semiconductor memory device 100, the nonvolatile memory 10, the read circuit array 20, the multiply-accumulate operator array 30, the input buffer 40, the output buffer 50, the operation controller 60, and the parallel conversion circuit 70 are disposed on the same semiconductor chip (e.g., silicon substrate) or in the same package. In some embodiments, the memory controller 80 is disposed on the same semiconductor chip (e.g., silicon substrate) or in the same package. Further, the circuits may be arbitrarily disposed on the same semiconductor chip or in the same package.

Figure 2:
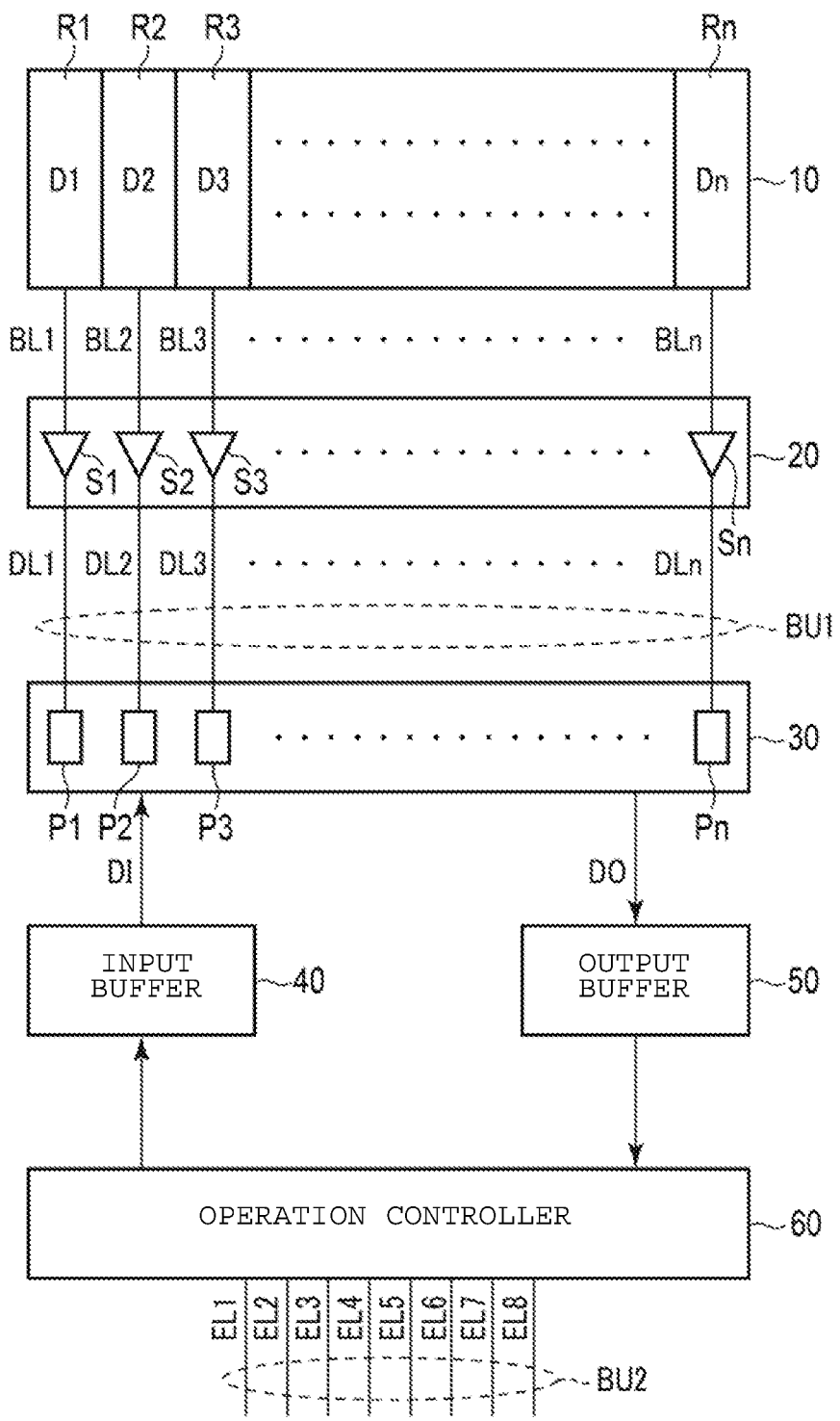
FIG. 2 is a diagram illustrating a circuit connection between a nonvolatile memory, a read circuit array, a multiply-accumulate operator array, and an operation controller illustrated in FIG. 1.

Next, the detailed configurations of the nonvolatile memory 10, the read circuit array 20, the multiply-accumulate operator array 30, and the operation controller 60 will be described. FIG. 2 is a diagram illustrating a circuit connection between the nonvolatile memory, the read circuit array, the multiply-accumulate operator array, and the operation controller illustrated in FIG. 1.

In some embodiments, in the nonvolatile memory 10, weighted data (hereinafter, referred to as parameter) is stored. The parameter may be used in the operation process in the multiply-accumulate operator array 30. For example, referring to FIG. 2, the nonvolatile memory 10 includes memory regions R1, R2, . . . , and Rn, where "n" is a natural number of 1 or more. In the memory regions R1, R2, . . . , and Rn, parameters D1, D2, . . . , and Dn may be stored respectively.

In some embodiments, in the memory cells in the memory regions R1, R2, . . . , and Rn, bit lines BL1, BL2, . . . , and BLn are connected, respectively. The bit lines BL1 to BLn whose number correspond to bits of a page for example, may transmit signals of the memory regions R1 to Rn in reading.

In some embodiments, the read circuit array 20 includes sense amplifiers S1, S2, . . . , and Sn which correspond to the bit lines BL1, BL2, . . . , and BLn, respectively. The bit lines BL1, BL2, . . . , and BLn may be connected to the sense amplifiers S1, S2, . . . , and Sn, respectively. The sense amplifiers S1 to Sn may read the read data from the signals transmitted through the bit lines BL1 to BLn. Further, the bit line may be configured to transmit one bit of data, or may be configured to transmit 8 bits, 16 bits, 32 bits, or 64 bits.

In some embodiments, the multiply-accumulate operator array 30 includes multiply-accumulate operators P1, P2, . . . , and Pn which correspond to the sense amplifiers S1, S2, . . . , and Sn (or the memory regions R1, R2, . . . , and Rn), respectively. The sense amplifiers S1, S2, . . . , and Sn and the multiply-accumulate operators P1, P2, . . . , and Pn may be connected by the bus BU1 which has the first bit width. The bus BU1 may include data lines DL1, DL2, . . . , and DLn. In other words, the sense amplifiers S1, S2, . . . , and Sn may be connected to the multiply-accumulate operators P1, P2, . . . , and Pn through the data lines DL1, DL2, . . . , and DLn.

In some embodiments, the number of data lines DL1 to DLn of the bus BU1 is set to be equal to the number of bit lines BL1 to BLn. In some embodiments, the configuration may also be formed in which the number (the first bit width) of data lines DL1 to DLn may be set to the number smaller than that of the bit lines, and larger than the number of bits of the second bit width of the bus BU2.

In some embodiments, the multiply-accumulate operation circuit array 30 is connected to the input buffer 40 and the output buffer 50. Input data DI stored in the input buffer 40 may be supplied to the multiply-accumulate operator array 30. Operation data DO output from the multiply-accumulate operator array 30 may be stored in the output buffer 50.

In some embodiments, the operation controller 60 and the host device 200 are connected by the bus BU2 which has the second bit width. Referring to FIG. 2, the bus BU2 includes external input/output lines EL1, EL2, . . . , and EL8, for example. In other words, the operation controller 60 may be connected to the host device 200 through the external input/output lines EL1, EL2, . . . , and EL8. The external input/output lines EL1 to EL8 may transmit input/output data between the operation controller 60 and the host device 200. The second bit width (or bus width) of the bus BU2 is, for example, 8 bits, which is smaller than the first bit width of the bus BU1.

Figure 3:
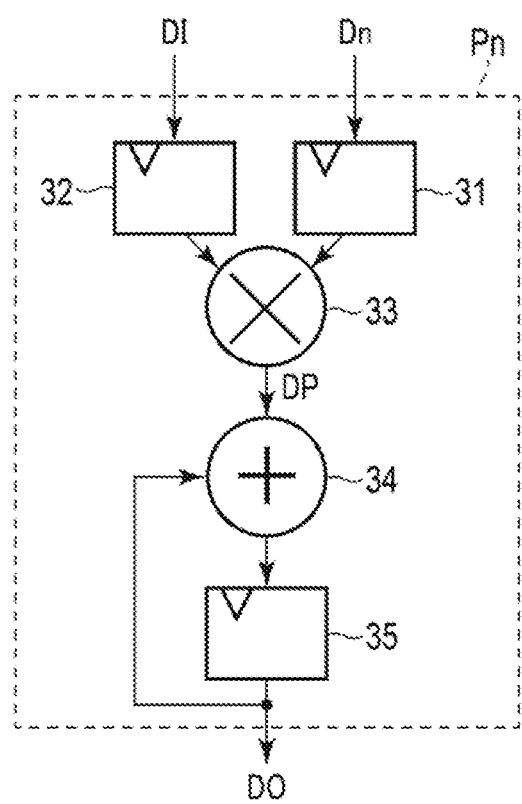
FIG. 3 is a diagram illustrating a configuration of a multiply-accumulate operator in the semiconductor memory device of the first embodiment.

Next, the detailed configuration of the multiply-accumulate operator Pn in the multiply-accumulate operator array 30 will be described. FIG. 3 is a diagram illustrating a configuration of the multiply-accumulate operator Pn.

In some embodiments, the multiply-accumulate operator Pn includes registers 31, 32, and 35, a multiplier 33, and an adder 34. The operation of the multiply-accumulate operator is as follows. The register 31 may store the parameter Dn supplied from the sense amplifier Sn in the read circuit array 20. The register 32 may store the input data DI supplied from the input buffer 40. The multiplier 33 may receive the parameter Dn and the input data DI, and multiply the parameter Dn and the input data DI. The adder 34 may add multiplied data DP and data DO fed back from the register 35, and output the added data to the register 35. The register 35 may store the added data, and output the added data as the data DO to the output buffer 50.

Figure 4:
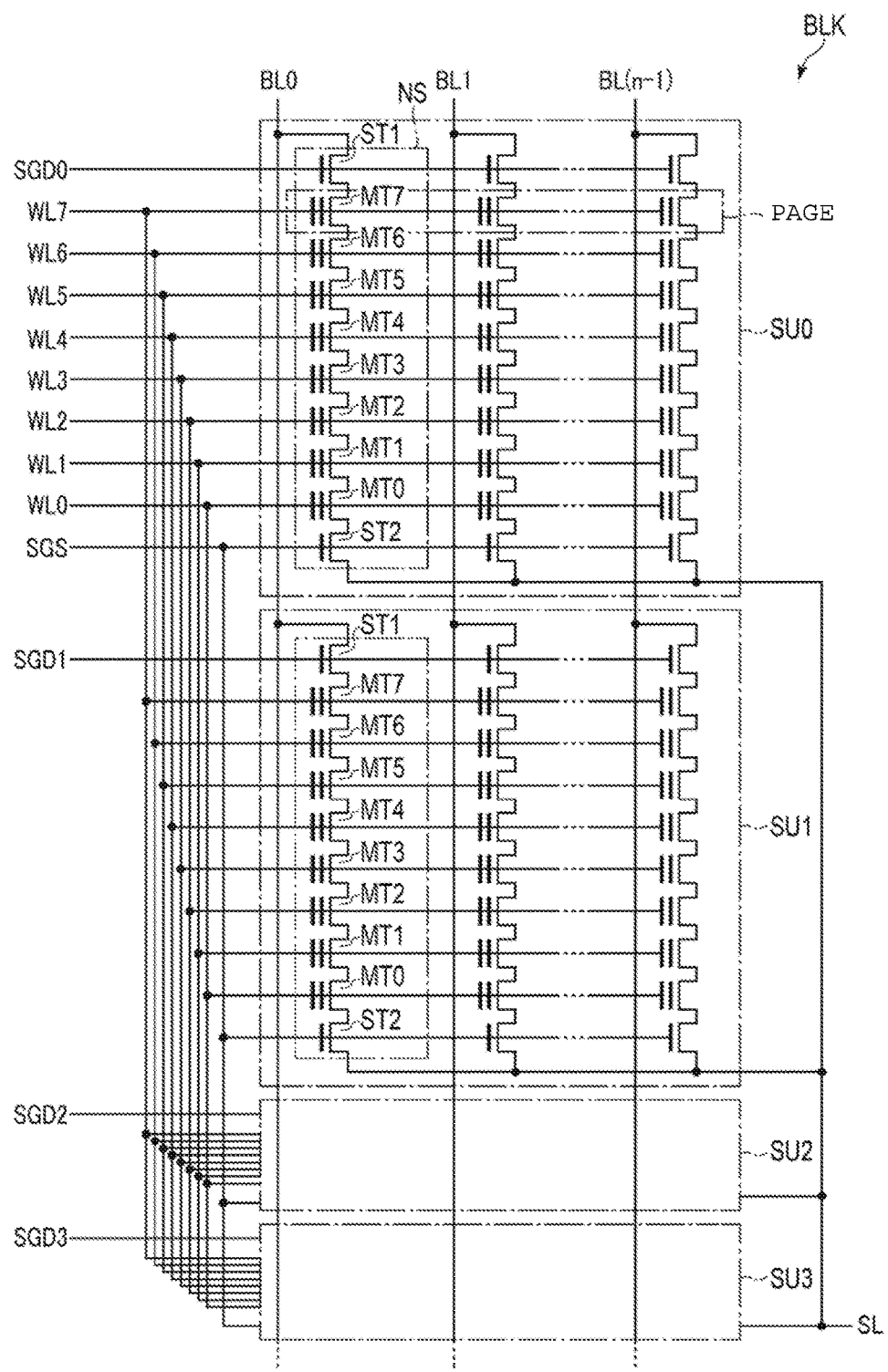
FIG. 4 is a circuit diagram of a memory cell array of the nonvolatile memory in the semiconductor memory device of the first embodiment.

Next, a memory cell array of the NAND flash memory will be described as an example of the nonvolatile memory 10. The NAND flash memory includes a plurality of blocks BLK (see FIG. 4) in the memory cell array. FIG. 4 is a circuit diagram of the block in the memory cell array which is provided in the NAND flash memory.

In some embodiments, as illustrated in FIG. 4, the block BLK includes four string units SU0, SU1, SU2, and SU3, for example. Further, each string unit may include a plurality of NAND strings NS. Further, the number of string units SU in one block BLK and the number of NAND strings NS in one string unit SU are arbitrary. Hereinafter, "SU" denotes each of the plurality of string units SU0 to SU3.

In some embodiments, each of the NAND string NS includes, for example, eight memory cell transistors MT0, MT1, . . . , and MT7 and select transistors ST1 and ST2. Further, a dummy transistor (not shown) may be provided between the memory cell transistor MT0 and the select transistor ST2 and between the memory cell transistor MT7 and the select transistor ST1. Hereinafter, "MT" denotes each of the memory cell transistors MT0 to MT7, and "ST" denotes each of the select transistors ST1 and ST2.

In some embodiments, the memory cell transistor MT is provided with a layered gate which includes a control gate and a charge storage layer, and stores data in a nonvolatile manner. Further, the memory cell transistor MT may be a MONOS (Metal-Oxide-Nitride-Oxide-Silicon) type in which an insulating film is used as the charge storage layer, or may be an FG (Floating Gate) type in which a conductive film is used as the charge storage layer. Further, the number of memory cell transistors MT may be other numbers such as 16, 32, 64, or 128, in addition to "8" as shown in FIG. 4. Furthermore, the number of select transistors (e.g., ST1 and ST2) is arbitrary.

In some embodiments, the sources or drains of the memory cell transistors MT0 to MT7 are connected in series between the select transistors ST1 and ST2. As shown in FIG. 4, the drain of the memory cell transistor MT7 at the one end of the series connection is connected to the source of the select transistor ST1, and the source of the memory cell transistor MT0 on the other end is connected to the drain of the select transistor ST2.

In some embodiments, the gates of the select transistors ST1 of the string units SU0 to SU3 are connected to select gate lines SGD0, SGD1, SGD2, and SGD3 respectively. Hereinafter, "SGD" denotes each of the select gate lines SGD0 to SGD3. The gates of the select transistors ST1 in the same string unit SU may be connected to the same select gate line SGD in common. For example, the gates of the select transistors ST1 in the string unit SU0 are connected to the select gate line SGD0 in common.

In some embodiments, the gates of the select transistors ST2 of the string units SU0 to SU3 are connected to the select gate line SGS. The gates of the select transistors ST2 in the same string unit SU may be connected to the same select gate line in common. For example, the gates of the select transistors ST2 in the string unit SU0 may be connected to the select gate line SGS in common.

In some embodiments, the control gates of the memory cell transistors MT0 to MT7 in the same block BLK are respectively connected to word lines WL0 to WL7 in common. In other words, while the word lines WL0 to WL7 are connected between the plurality of string units SU in the same block BLK in common, the select gate lines SGD and SGS are independent at every string unit SU even in the same block.

In some embodiments, in the NAND strings NS disposed in the memory cell array in a matrix configuration, the drains of the select transistors ST1 of the NAND strings NS of the same row are connected to any one of the bit lines BL0, BL1, . . . , and BL (n−1) in common. Further, "n" is a natural number of 1 or more. In FIG. 4, the starting bit line is denoted as BL0. Hereinafter, in a case where the bit line BL is denoted, it means each of the bit lines BL0 to BL(n−1). In other words, the bit line BL is connected to the NAND strings NS in the plurality of string units SU in common.

In some embodiments, the sources of the select transistors ST2 of the NAND strings NS in the string units SU0 to SU3 are connected to a source line SL in common.

Reading and programming of data are collectively performed on the plurality of memory cell transistors MT commonly connected to any word line WL in any string unit SU of any block BLK. A unit of the reading and programming processing is called "page".

In some embodiments, a data erase range may be set to other forms in addition to one block BLK. For example, the plurality of blocks may be collectively erased, or some regions in one block BLK may be collectively erased.

Next, the operation of the semiconductor memory device of the first embodiment will be described. In some embodiments, referring to FIG. 2, the nonvolatile memory 10 includes the memory regions R1, R2, . . . , and Rn, and weighted data (or parameters) D0 to Dn is stored in the memory regions R1, R2, . . . , and Rn, respectively.

In some embodiments, the sense amplifiers S1 to Sn in the read circuit array 20 read the parameters from the memory regions R1 to Rn, respectively.

In some embodiments, the multiply-accumulate operators P1 to Pn in the multiply-accumulate operator array 30 receive the parameters D1 to Dn read by the sense amplifiers S1 to Sn through the data lines DL1 to DLn, respectively. In other words, the parameters D1 to Dn are transmitted from the sense amplifiers S1 to Sn to the multiply-accumulate operators P1 to Pn using the bus BU1 (the data lines DL1 to DLn) having a first bit width. The first bit width may correspond to the number of bits of the page. Alternatively, the first bit width may be smaller than the page, and correspond to the number of bits larger than the second bit width of the bus BU2. In some embodiments, the multiply-accumulate operators P1 to Pn each receive the input data DI from the input buffer 40. The multiply-accumulate operators P1 to Pn may perform a multiply-accumulate operation with the parameters D1 to Dn and the input data DI, and output the operation data DO.

In this way, the multiply-accumulate operators P1 to Pn can receive the parameters D1 to Dn obtained by one reading operation of the read circuit array 20, and can perform the multiply-accumulate operation using the parameters D1 to Dn. Therefore, it is possible to improve a processing speed of the multiply-accumulate operation in the multiply-accumulate operator array 30.

In some embodiments, the output buffer 50 stores the operation data DO output from the multiply-accumulate operator array 30, and outputs the operation data DO to the operation controller 60.

In some embodiments, the operation controller 60 outputs the received operation data DO to the host device 200 through the external input/output lines EL1 to EL8. In other words, the operation data DO is transmitted from the operation controller 60 to the host device 200 using the bus BU2 (the external input/output lines EL1 to EL8) of the second bit width. The second bit width may be 8 bits, for example.

Figure 5:
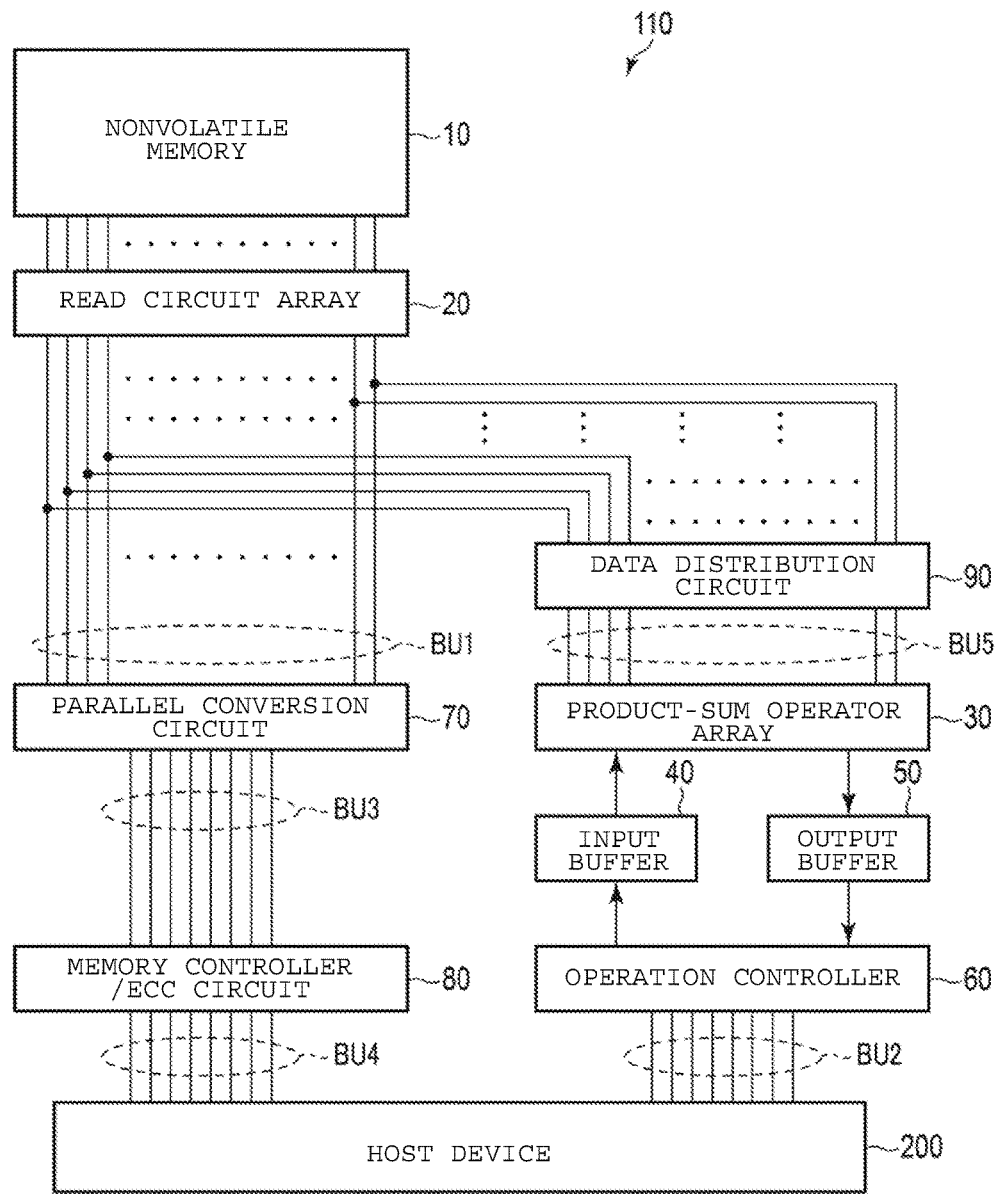
FIG. 5 is a circuit diagram illustrating a configuration of a semiconductor memory device of a modification of the first embodiment.

In some embodiments, the read circuit array 20 and the multiply-accumulate operator array 30 are directly connected, and the memory region Rn and the multiply-accumulate operator Pn are associated with each other. For example, a data distribution circuit is provided, and the data distribution circuit distributes the parameter Dn supplied from the sense amplifier Sn in the read circuit array 20 to the multiply-accumulate operator Pn corresponding to the parameter Dn. With reference to FIG. 5, this example will be described.

FIG. 5 is a circuit diagram illustrating a configuration of a semiconductor memory device showing a modification of the first described embodiment. As illustrated in the drawing, a semiconductor memory device 110 includes a data distribution circuit 90 between the read circuit array 20 and the multiply-accumulate operator array 30.

In some embodiments, the read circuit array 20 and the data distribution circuit 90 are connected by the bus BU1 having a first bit width similarly to the multiply-accumulate operator array 30 in FIG. 1. The data distribution circuit and the multiply-accumulate operator array 30 may be connected by a bus BU5 of the first bit width similarly. The data distribution circuit 90 may distribute the parameter Dn supplied from the sense amplifier Sn in the read circuit array 20 to the multiply-accumulate operator Pn corresponding to the parameter Dn. In some embodiments, the data distribution circuit 90 includes a buffer configured to temporarily store the the parameters supplied from the sense amplifiers.

In some embodiments, the parameter Dn is distributed to the multiply-accumulate operator Pn corresponding to the parameter Dn by the data distribution circuit 90. Therefore, there is no need to store the parameter Dn associated with the memory region Rn in advance. The remaining configuration is similar to those of the above-described first embodiment.

Effect of First Embodiment

According to the embodiments illustrated in FIG. 1 to FIG. 5 (as the first embodiment), it is possible to provide the semiconductor memory device which is able to realize high speed and low power consumption in operation.

In the first embodiment, the read data read from the nonvolatile memory 10 by the read circuit array 20 is supplied to the multiply-accumulate operator array 30 without any change. There is no need to adjust a bit width of the read data, for example, before the read data is supplied to the multiply-accumulate operator array 30. Therefore, it is possible to improve a processing speed of the multiply-accumulate operation in the multiply-accumulate operator array 30, and the power consumption can be reduced.

In addition, in the embodiment illustrated in FIG. 5, the data (parameter Dn) corresponding to the multiply-accumulate operator Pn can be distributed by the data distribution circuit 90, so that there is no need to store the data associated to the memory region Rn in the nonvolatile memory in advance, and the flexibility of the nonvolatile memory is improved.

Figure 6:
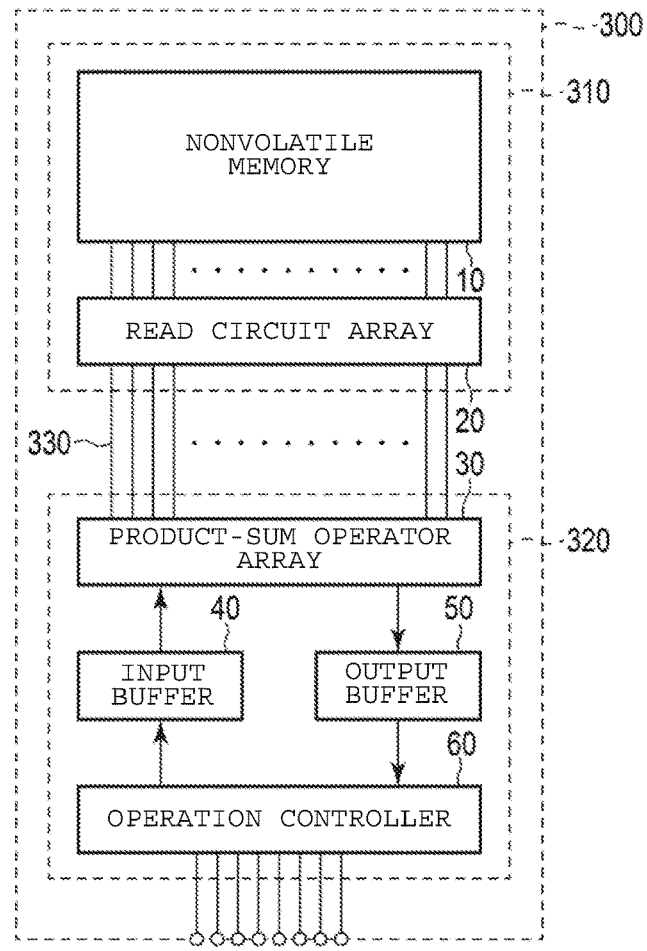
FIG. 6 is a circuit diagram illustrating a configuration of a semiconductor memory device of a second embodiment.
Figure 7:
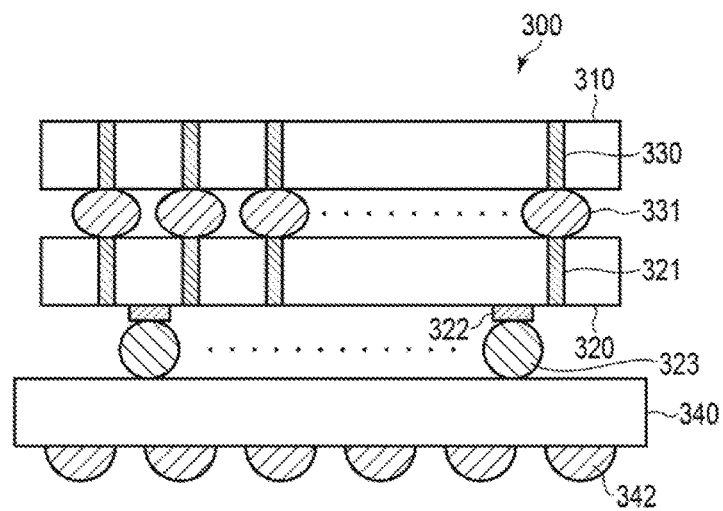
FIG. 7 is a cross-sectional view illustrating a configuration of the semiconductor memory device of the second embodiment.

With reference to FIG. 6 and FIG. 7, the second embodiment will be described as to an example in which the nonvolatile memory 10 and the multiply-accumulate operator array 30 are disposed on different semiconductor chips, and are connected by a TSV (Through Silicon Via). The following description of the second embodiment highlights the differences from the first embodiment.

FIG. 6 is a circuit diagram illustrating a configuration of a semiconductor memory device of the second embodiment. In some embodiments, a package 300 includes semiconductor chips 310 and 320. The terminals of the semiconductor chip 310 and the semiconductor chip 320 may be connected by a TSV (Through Silicon Via) 330.

In some embodiments, in the semiconductor chip 310, the nonvolatile memory 10 and the read circuit array 20 are disposed. In the semiconductor chip 320, the multiply-accumulate operator array 30, the input buffer 40, the output buffer 50, and the operation controller 60 may be disposed. The read circuit array 20 in the semiconductor chip 310 and the multiply-accumulate operator array 30 in the semiconductor chip 320 may be electrically connected by the TSV 330.

The structure of the package 300 will be described using FIG. 7, which depicts a cross-sectional view of the structure of the package 300. In some embodiments, the package 300 is made as a package by stacking the semiconductor chip 320 and the semiconductor chip 310 on a package substrate 340. As a method of stacking the semiconductor chips 320 and 310, a TSV method may be used.

In the following, the structure of the package 300 will be described in detail. In some embodiments, on an upper surface of the package substrate 340, the semiconductor chip 320 is disposed, and the semiconductor chip 310 is further disposed on the semiconductor chip 320.

In some embodiments, in the semiconductor chip 320, at least one TSV 321 is provided from an upper surface of the semiconductor chip 320 to a bottom surface of the semiconductor chip 320. In some embodiments, in the semiconductor chip 310, at least one TSV 330 is provided from an upper surface of the semiconductor chip 310 to a bottom surface of the semiconductor chip 310. The TSVs 321 and 330 may be vias which are electrically conductive from the upper surface to the bottom surface of each semiconductor chip. A bump 331 may be provided between the TSVs 321 and 330. The TSVs 321 and 330 and the bump 331 may be electrically connected between the semiconductor chips 320 and 310.

In some embodiments, an electrode 322 is provided on the bottom surface of the semiconductor chip 320. A bump 323 may be provided between the electrode 322 and the package substrate 340. For example, the semiconductor chip 320 is electrically connected to the package substrate 340 through the TSV 321, the electrode 322, and the bump 323. In addition, the semiconductor chip 310 may be electrically connected to the package substrate 340 through the TSV 330, the bump 331, the TSV 321, the electrode 322, and the bump 323.

In some embodiments, a bump 342 is provided on the bottom surface of the package substrate 340. In a case where the package 300 is a BGA (ball grid array) package, the bump 342 may be a soldering ball. The package substrate 340 may be electrically connected to the outside (for example, the host device 200) through the bump 342.

In some embodiments, the package 300 is configured as an integrated circuit dedicated to the operation process. For example, when the parallel conversion circuit 70 and the memory controller 80 are added (see FIG. 1), it is possible to form a general purpose nonvolatile memory.

The remaining configuration and operation of the second embodiment are similar to those of the first embodiment.

Effect of Second Embodiment

In the second embodiment, the nonvolatile memory 10 and the multiply-accumulate operator array 30 are disposed on different semiconductor chips, and connected by the TSV. With such a configuration, even in a case where the nonvolatile memory 10 and the multiply-accumulate operator array 30 are not possible to be disposed on the same semiconductor chip, the read circuit array 20 and the multiply-accumulate operator array 30 can be connected by the TSV 330, so that it is possible to realize a high-speed operation process and to reduce power consumption. The other effects are similar to those of the above-described first embodiment.

While certain embodiments have been described, these embodiments have been presented by way of example only, and are not intended to limit the scope of the present disclosure. Indeed, the novel embodiments described herein may be embodied in a variety of other forms; furthermore, various omissions, substitutions and changes in the form of the embodiments described herein may be made without departing from the spirit of the present disclosure. The accompanying claims and their equivalents are intended to cover such forms or modifications as would fall within the scope and spirit of the present disclosure.

What is claimed is:

1. A semiconductor memory device, comprising:
a nonvolatile memory configured to store data in a nonvolatile manner;
a read circuit configured to read the data from the nonvolatile memory;
an operation circuit configured to receive the data read from the read circuit and carry out at least one operation;
a first bus connected between the read circuit and the operation circuit and having a first bit width;
a controller circuit electrically connected to the operation circuit;
a second bus connected to the controller circuit and having a second bit width smaller than the first bit width;
wherein the operation circuit is further configured to carry out an operation using first data transmitted from the read circuit through the first bus and second data supplied from the controller circuit, and output third data obtained by the operation, and
wherein the controller circuit is configured to receive the third data, and output the received third data through the second bus.

2. The semiconductor memory device according to claim 1,
wherein the read circuit is directly connected to the operation circuit by the first bus.

3. The semiconductor memory device according to claim 1, further comprising:
a data distribution circuit connected to the first bus between the read circuit and the operation circuit,
wherein the data distribution circuit is configured to distribute data transmitted via the first bus to a circuit corresponding to the data among the operation circuit.

4. The semiconductor memory device according to claim 1,
wherein the first bit width of the first bus is the same as the number of bits of a page of the nonvolatile memory.

5. The semiconductor memory device according to claim 1,
wherein at least two of the nonvolatile memory, the read circuit, the operation circuit, and the controller circuit are disposed in the same semiconductor chip or in the same chip package.

6. The semiconductor memory device according to claim 1,
wherein the operation circuit includes a multiply-accumulate operator which performs a multiply-accumulate operation.

7. The semiconductor memory device according to claim 1,
wherein at least one of the nonvolatile memory or the read circuit is disposed in a first semiconductor chip different from a second semiconductor chip containing at least one of the operation circuit or the controller circuit.

8. The semiconductor memory device according to claim 1, further comprising:
a parallel conversion circuit configured to receive the data read from the read circuit,
wherein the first bus is connected between the read circuit and the parallel conversion circuit.

9. The semiconductor memory device according to claim 8, further comprising:
a memory controller circuit electrically connected to the parallel conversion circuit,
wherein a third bus connected between the parallel conversion circuit and the memory controller circuit and having a third bit width smaller than the first bit width.

10. The semiconductor memory device according to claim 9, further comprising:
a fourth bus connected to the memory controller circuit and having a fourth bit width smaller than the first bit width.

11. The semiconductor memory device according to claim 3, further comprising:
a fifth bus connected between the data distribution circuit and the operation circuit and having the same bit width as the first bit width.

12. The semiconductor memory device according to claim 1, further comprising:
a package including a first semiconductor chip and a second semiconductor chip,
wherein the nonvolatile memory and the read circuit are disposed in the first semiconductor chip, and
wherein the operation circuit and the controller circuit are disposed in the second semiconductor chip.

13. The semiconductor memory device according to claim 12,
wherein the first semiconductor chip and the second semiconductor chip are connected by a bump.

14. The semiconductor memory device according to claim 13,
wherein a TSV (Through Silicon Via) is provided from an upper surface of the first semiconductor chip to a bottom surface of the first semiconductor chip.

15. A semiconductor memory device, comprising:
a nonvolatile memory including a plurality of memory cells;
a first circuit configured to read data from a portion of the plurality of memory cells and to transmit the read data via a first bus having a first bit width; and
a second circuit configured to receive the transmitted data via the first bus, carry out at least one operation, and transmit, via a second bus, the data to which the at least one operation have carried out, the second bus having a second bit width smaller than the first bit width;
wherein the second circuit is further configured to carry out an operation using first data transmitted from the first circuit through the first bus and second data different from the first data and output third data obtained by the operation through the second bus.

16. The semiconductor memory device according to claim 15, wherein the first circuit is directly connected to the second circuit by the first bus.

17. The semiconductor memory device according to claim 15, wherein the first bit width of the first bus is the same as the number of bits of a page of the nonvolatile memory.

18. The semiconductor memory device according to claim 15, wherein the second circuit includes a multiply-accumulate operator which performs a multiply-accumulate operation.

19. The semiconductor memory circuit according to claim 15, wherein at least one of the nonvolatile memory or the first circuit is disposed in a first semiconductor chip different from a second semiconductor chip containing at least the second circuit.

20. A semiconductor memory device, comprising:
a nonvolatile memory configured to store data in a nonvolatile manner;
a read circuit configured to read the data from the nonvolatile memory;
an operation circuit configured to receive the data read from the read circuit and carry out at least one operation;
a first bus connected between the read circuit and the operation circuit and having a first bit width;
a controller circuit electrically connected to the operation circuit;
a second bus connected to the controller circuit and having a second bit width smaller than the first bit width; and
a parallel conversion circuit configured to receive the data read from the read circuit,
wherein the first bus is further connected between the read circuit and the parallel conversion circuit.

* * * * *